(12) United States Patent
Tyckowski et al.

(10) Patent No.: US 6,515,441 B1
(45) Date of Patent: Feb. 4, 2003

(54) GLASS EDGE OBJECT DETECTION SENSOR

(75) Inventors: Joseph Tyckowski, Clawson, MI (US); Christos Kyrtsos, Southfield, MI (US); Timothy Davies, Hermitage, TN (US); Charles Hopson, Lebanon, TN (US); Francois Breynaert, Caen (FR); Pascal Bonduel, Bouzy la Foret (FR)

(73) Assignee: Meritor Light Vehicle Systems, Inc., Troy, MI (US)

( * ) Notice: Subject to any disclaimer, the term of this patent is extended or adjusted under 35 U.S.C. 154(b) by 0 days.

(21) Appl. No.: 09/391,066

(22) Filed: Sep. 7, 1999

(Under 37 CFR 1.47)

(51) Int. Cl.[7] .............................. G05B 5/00; H02H 7/08; H02P 1/00; H02P 3/00; H02P 7/00
(52) U.S. Cl. .................. 318/445; 318/450; 318/458; 318/467; 318/479; 318/488; 340/545.4
(58) Field of Search .................. 318/445, 450, 318/449, 455, 458, 467, 468, 479, 488, 286, 481; 307/10.1, 116, 130; 340/545.1, 545.2, 545.4, 545.7, 660

(56) References Cited

U.S. PATENT DOCUMENTS

| | | | | |
|---|---|---|---|---|
| 4,143,367 A | * | 3/1979 | Schestag | 340/540 |
| 4,351,016 A | * | 9/1982 | Felbinger | 361/181 |
| 4,410,843 A | * | 10/1983 | Sauer et al. | 318/317 |
| 4,453,112 A | * | 6/1984 | Sauer et al. | 318/281 |
| 4,943,757 A | * | 7/1990 | Richter et al. | 318/468 |
| 5,166,586 A | * | 11/1992 | Yaguchi | 318/434 |
| 5,621,290 A | * | 4/1997 | Heller et al. | 318/466 |
| 5,754,017 A | * | 5/1998 | Tsuge et al. | 318/286 |
| 6,002,228 A | * | 12/1999 | Knab | 318/469 |
| 6,160,370 A | * | 12/2000 | Ohnuma | 318/445 |

* cited by examiner

*Primary Examiner*—Robert E. Nappi
*Assistant Examiner*—Edgardo San Martin
(74) *Attorney, Agent, or Firm*—Carlson, Gaskey & Olds

(57) ABSTRACT

An object detection system includes a sensor in communication with a controller which identifies contact with the sensor. In a preferred embodiment the sensor is a piezo film which generates a signal when an object applies a predetermined force to the edge of the moveable glass member. This signal is identifiable by the controller in communication with the piezo film. Another embodiment of the sensor provides a pair of substantially parallel segments of conductive material applied along the edge of the window. When an object is in contact with both segments of conductive material an electrical signal is conducted and identified by the controller. When the controller determines an object is in contact with the sensor and therefore the moveable glass member, the controller halts or reverses the movement of the moveable glass member to prevent trapping the object between the closing moveable glass member and the frame.

11 Claims, 2 Drawing Sheets

GLASS EDGE OBJECT DETECTION SENSOR

BACKGROUND OF THE INVENTION

The present invention relates to a power window, and more particularly to an apparatus for detecting an object in the path of a vehicle power window.

Power window mechanisms are commonly known. Recently, one-touch up power windows have been included in vehicles which allow the window to be closed by a single press of the power window operating button. Additionally, such mechanisms are known for vehicle sunroofs and the like. The proliferation of such power window mechanisms has increased the possibility that an object could be captured in the closing window.

Accordingly, it is desirable to provide an object detection system to prevent such possibility of capture. It is further desirable to provide a robust, reliable, lightweight and inexpensive system for vehicle use.

SUMMARY OF THE INVENTION

The object detection system of the present invention generally includes a sensor and a controller which identifies contact with the sensor. The sensor is preferably attachable to a moveable member edge of a window assembly that typically includes a moveable glass member and a frame. Although a window is shown and described, the present invention is similarly applicable to a vehicle sunroof or other closeable member.

In a preferred embodiment the sensor is a piezo film located along the edge of the moveable glass member. The piezo film generates a signal when an object applies a predetermined force to the edge of the moveable glass member. This signal is identifiable by the controller in communication with the piezo film. The controller compares the signal from the film to a reference. If the signal is within a predetermined range of the reference, then a determination is made that no objects are in contact with the moveable glass member. However, if an object is in contact with the moveable window glass, the controller identifies the increase in signal strength and determines that an object is in contact with the moveable window glass.

Another embodiment of the sensor provides a pair of substantially parallel segments of conductive material applied along the edge of the window. When an object is in contact with both segments of conductive material an electrical signal is conducted and identified by the controller.

When the controller determines an object is in contact with the sensor and therefore the moveable glass member, the controller halts or reverses the movement of the moveable glass member to prevent trapping the object between the closing moveable glass member and the frame.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1:
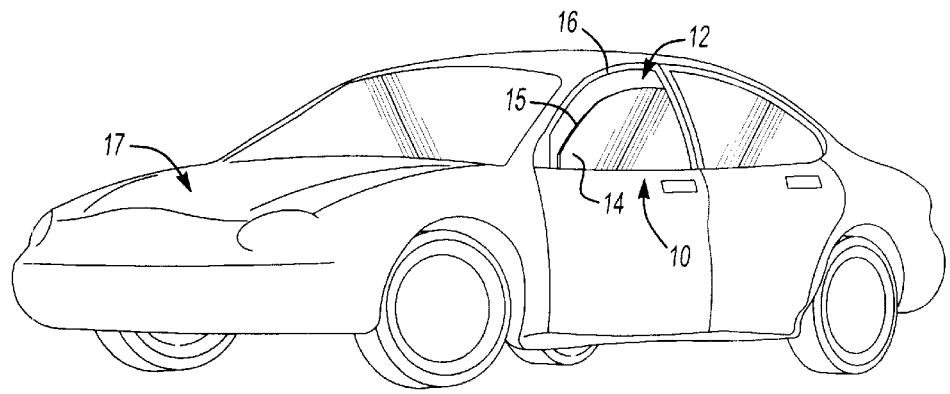
FIG. 1 is a general schematic representation of a vehicle having a moveable window.

FIG. 1 illustrates an object detection system 10 according to the present invention. The system 10 is preferably attachable or integral to a window assembly 12 having a moveable glass member 14 and a frame 16 typical of a vehicle 17 having a power window, sunroof, or the like.

Figure 2:
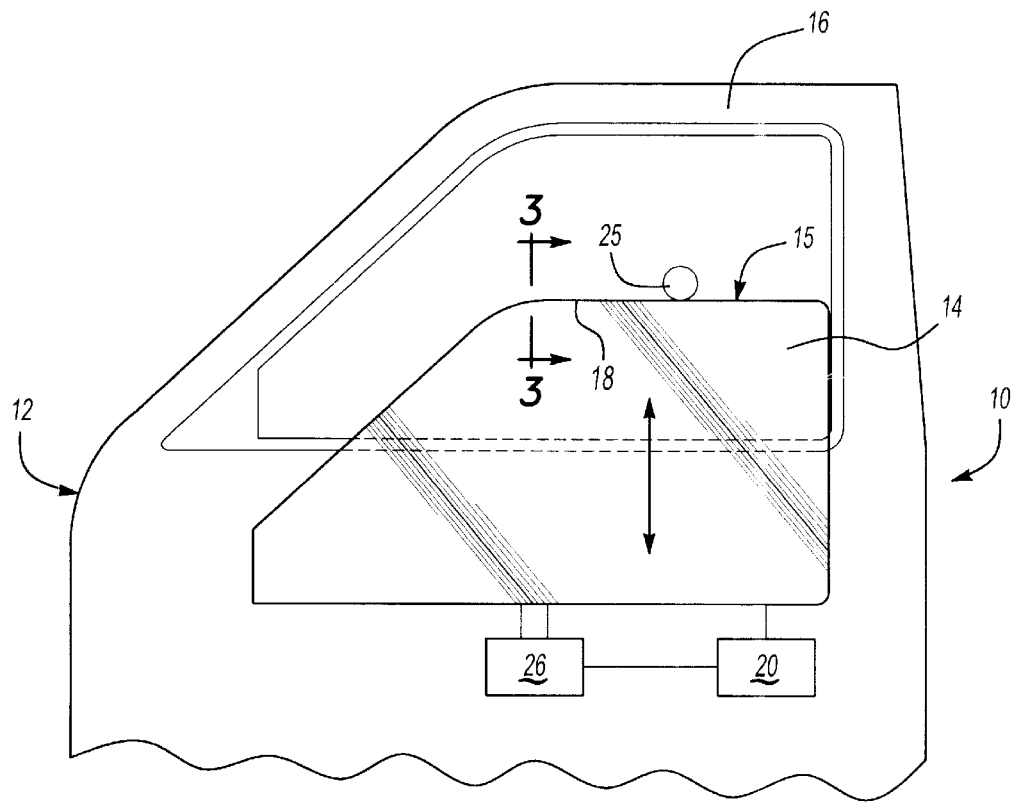
FIG. 2 is a general schematic representation of the electromagnetic detection sensor according to the present invention.

As shown in FIG. 2, the system 10 generally includes a sensor 18 in communication with a controller 20. As will be more full described below, the sensor 18 identifies an object (shown schematically at 25) coming into contact with an edge 15 of the moveable glass member 14. The sensor 18 is preferably positioned along the edge 15 in the closure path of the moveable glass member 14. The controller 20, in response to the sensor 18, can then halt or reverse the movement of the moveable glass member 14 to prevent trapping the object 25 between the closing moveable glass member 14 and the frame 16.

To achieve this control, the controller 20 communicates with a power window motor (shown schematically at 26) attached to the window 14 through a drive linkage. Additionally, the sensor 18 can be maintained in a dormant state and operated only when the moveable glass member 14 is being closed. Also, controller 20 is programmed to recognize the end of travel, or fully closed position of window 14. At the closed position, the motor 26 is stopped, but not reversed.

Figure 3:
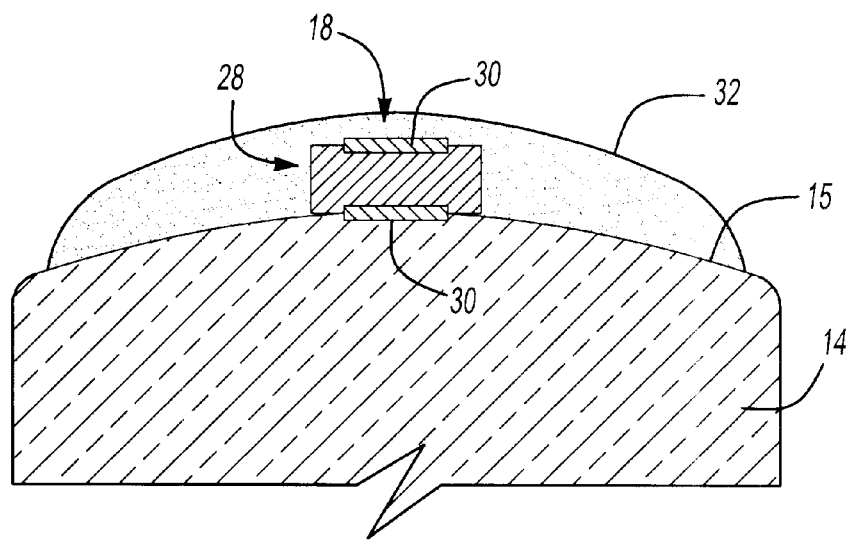
FIG. 3 is a cross section of a sensor according the present invention taken along the line 3—3 of FIG. 2.

FIG. 3 illustrates a cross section of the sensor 18 and window 14 taken along the line 3—3 of FIG. 2. In a preferred embodiment the sensor 18 is a piezo film 28 located along the edge 15 of the moveable glass member 14. The piezo film 28 includes a pair of electrodes 30 which generate a signal when an object applies a predetermined force to the edge 15 of the moveable glass member 14. This signal is identifiable by the controller 20 in communication with the piezo film 28. Piezo electric type switches are commonly known and the details of such a switch will not be described here. However, various switches are contemplated and equally applicable to the present invention.

The controller 20 compares the signal from the film 28 to a reference. If the signal is within a predetermined range of the reference, then a determination is made that no objects are in contact with the moveable glass member 14. However, if an object is in contact with the moveable window glass 14, the strength of the signal will increase above the reference. The controller 20 identifies the increase in signal strength and determines that an object is in contact with the moveable window glass 14. Control and identification can be provided by signal processing circuitry well known in the art.

To protect the piezo film 28 from adverse conditions a thin insulating coating 32 such as epoxy can be applied over the piezo film 28. Alternatively, the piezo film 28 can be integral to the moveable glass member 14 for complete protection. Of course, the coating should be sized so that sensor 18 still operates through the film.

Figure 4:
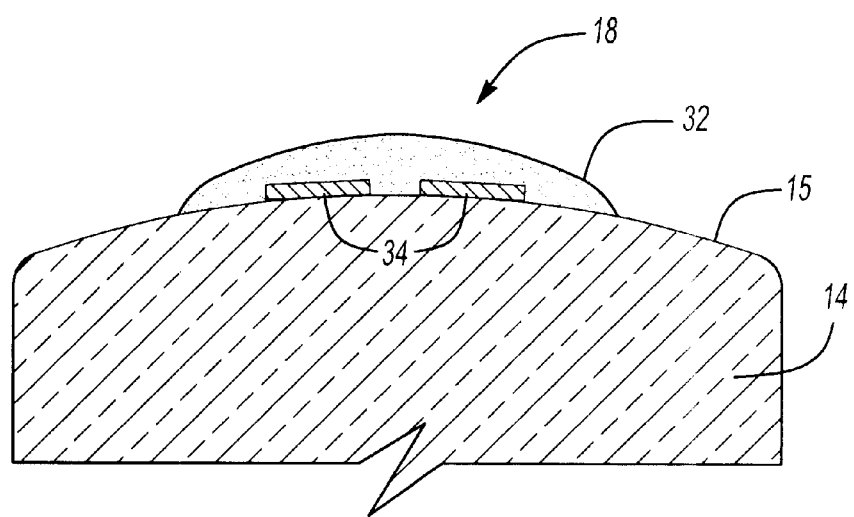
FIG. 4 is a cross-section of an alternate embodiment of the sensor taken along the line 3—3 of FIG. 2.

An alternate embodiment of the sensor 18 is shown in FIG. 4 which similarly illustrates a cross section of the sensor 18 and window 14 taken along the line 3—3 of FIG. 2. The sensor 18 in FIG. 4 illustrates a pair of substantially parallel segments of conductive material 34. Preferably, the segments of conductive material 34 can be applied along the edge 15 of the window 14 using a conductive paint such as a silver epoxy. When an object 25 (FIG. 1) is in contact with both segments of conductive material 34 an electrical signal is conducted. The controller 20 identifies the signal and then halts or reverse the movement of the moveable glass member 14 to prevent trapping the object 25 between the closing moveable glass member 14 and the frame 16.

Additionally, the exposed segments of conductive material 34 can be covered with the thin insulating coating 32 described above. The coating 32 protects the conductive material 34 and creates a transmission line between the segments. A high frequency voltage can then be applied to one segment of conductive material 34 and the reflection monitored by the controller 20. An object 25 in proximity with the conductive material 34 will change the electrical characteristics of the system and the controller 20 can halt or reverse the moveable glass member 14 as described above. Alternatively, a constant voltage is applied to one segment of conductive material 34 and the voltage of the other segment is measured by a CMOS device, Field Effect Transistor or the like in communication with the controller 20.

The appropriate electronics to achieve the FIG. 4 are well within the skill of a worker in this area. The foregoing description is to be exemplary rather than defined by the limitations within. Many modifications and variations of the present invention are possible in light of the above teachings. The preferred embodiments of this invention have been disclosed, however, one of ordinary skill in the art would recognize that certain modifications would come within the scope of this invention. It is, therefore, to be understood that within the scope of the appended claims, the invention may be practiced otherwise than as specifically described. For that reason the following claims should be studied to determine the true scope and content of this invention.

What is claimed is:

1. An object detection system for a vehicle closure member comprising:
   a moveable closure member;
   a piezo film mounted to an edge of said moveable closure member; and
   a controller in communication with said sensor, said controller operable to identify an object which exerts a predetermined force upon said piezo film.

2. The system as recited in claim 1, wherein said controller reverses the direction of said moveable closure member in response to identification of an object within said predetermined proximity to said sensor.

3. A window assembly comprising:
   a window glass having an edge, said window glass moveable in a first and second direction;
   a piezo film mounted to said edge of said moveable window glass; and
   a controller in communication with said sensor, said controller operable to identify an object which exerts a predetermined force upon said piezo film.

4. The assembly as recited in claim 3, wherein said controller only operates to identify said object when said window glass is being moved in said first direction.

5. The assembly as recited in claim 3, wherein said sensor is integral to said window glass.

6. The assembly as recited in claim 3, wherein said controller stops the movement of said window glass in response to identification of said object.

7. The system as recited in claim 1, wherein said piezo film not sending a signal above a predetermined magnitude when no object is in contact with said closure, but sending a signal above a predetermined level when an object is in contact with said closure.

8. The assembly as recited in claim 3, wherein said piezo film not sending a signal above a predetermined magnitude when no object is in contact with said closure, but sending a signal above a predetermined level when an object is in contact with said closure.

9. A window assembly comprised of:
   a moveable window glass having an edge;
   an electrical sensor attached to said edge, so that electrical sensor being operable to send a signal above a predetermined maximum only when an object is in contact with said edge, and to not send the signal above said level when no object is in contact with said edge; and
   to control their communication with said electrical sensor, said controller being operable to measure said signal and determine an object in contact with said edge, when said signal is above said predetermined level.

10. The assembly as set forth in claim 9, wherein said electrical sensor comprises a first and second conductor attached to said edge, said first conductor being supplied with the voltage in said second conductor being connected to said controller, such that when an object bridges said first and second conductors, then a signal is sent.

11. The assembly as set forth in claim 10, wherein said electrical sensor includes a piezo film which generates a signal when an object is in contact with said film.

* * * * *

UNITED STATES PATENT AND TRADEMARK OFFICE
CERTIFICATE OF CORRECTION

PATENT NO.   : 6,515,441 B1
DATED        : February 4, 2003
INVENTOR(S)  : Tyckowski et al.

It is certified that error appears in the above-identified patent and that said Letters Patent is hereby corrected as shown below:

<u>Column 4,</u>
Line 44, "10" should be -- 9 --.

Signed and Sealed this

Twelfth Day of August, 2003

JAMES E. ROGAN
*Director of the United States Patent and Trademark Office*